(12) United States Patent
Taylor et al.

(10) Patent No.: US 7,339,181 B2
(45) Date of Patent: Mar. 4, 2008

(54) HIGH FLUX, HIGH ENERGY PHOTON SOURCE

(75) Inventors: Alan G. Taylor, London (GB); Christopher J. Barnett, Bromley (GB); David R. Klug, London (GB); Ian P. Mercer, Keymer (GB)

(73) Assignee: Powerlase Limited, Crawley, West Sussex (GB)

( * ) Notice: Subject to any disclaimer, the term of this patent is extended or adjusted under 35 U.S.C. 154(b) by 817 days.

(21) Appl. No.: 10/703,923

(22) Filed: Nov. 7, 2003

(65) Prior Publication Data

US 2006/0017023 A1 Jan. 26, 2006
US 2007/0278429 A9 Dec. 6, 2007

Related U.S. Application Data

(63) Continuation of application No. PCT/GB02/02063, filed on May 3, 2002.

(30) Foreign Application Priority Data

May 8, 2001 (GB) .................. 0111204.4

(51) Int. Cl.
*H05H 1/04* (2006.01)
(52) U.S. Cl. .............. 250/504 R; 250/423 P; 250/426; 378/119
(58) Field of Classification Search ........... 250/504 R
See application file for complete search history.

(56) References Cited

U.S. PATENT DOCUMENTS

| | | | |
|---|---|---|---|
| 4,723,262 A | 2/1988 | Noda et al. | |
| 4,752,946 A * | 6/1988 | Gupta et al. | 378/119 |
| 5,086,254 A | 2/1992 | Wells | |
| 5,577,092 A | 11/1996 | Kublak et al. | |
| 6,002,744 A | 12/1999 | Hertz et al. | |
| 6,011,267 A * | 1/2000 | Kubiak et al. | 250/423 P |
| 6,031,241 A | 2/2000 | Silfvast et al. | |
| 6,084,198 A | 7/2000 | Birx | |
| 6,133,577 A | 10/2000 | Gutowski et al. | |
| 6,973,164 B2 * | 12/2005 | Hartlove et al. | 378/119 |

FOREIGN PATENT DOCUMENTS

| | | |
|---|---|---|
| EP | 0858249 | 8/1998 |
| JP | 5866296 | 4/1983 |
| JP | 03102888 | 4/1991 |

(Continued)

OTHER PUBLICATIONS

Bergmann, K., Schriever, G., Rosier, O., Muller, M., Neff, W., and Lebert, R., "Highly Repetitive, extreme-ultraviolet radiation source based on a gas-discharge plasma"; Applied Optics, Sep. 1, 1999, vol. 38, No. 25, pp. 5413-5417.

*Primary Examiner*—Nikita Wells
*Assistant Examiner*—Phillip A. Johnston
(74) *Attorney, Agent, or Firm*—Reinhart Boerner Van Deuren s.c.

(57) ABSTRACT

A high energy photon source for generating EUV radiation comprises a nozzle emitting a supersonic stream of source material, a laser or electrical/magnetic pre-ionization mechanism and a laser or electrical/magnetic excitation mechanism and a skimmer plate between them providing a collimated high density beam of source material for excitation.

7 Claims, 3 Drawing Sheets

FOREIGN PATENT DOCUMENTS

| WO | WO9740650 | 10/1997 |
|----|-----------|---------|
| WO | WO9834234 | 8/1998 |
| WO | WO9951357 | 10/1999 |
| WO | WO0130122 | 4/2001 |
| WO | WO0149087 | 7/2001 |

* cited by examiner

HIGH FLUX, HIGH ENERGY PHOTON SOURCE

CROSS REFERENCE TO RELATED APPLICATIONS

This application is a continuation of International Application Number PCT/GB2002/002063, which was filed on May 3, 2002 and published as International Publication Number WO 2002/091807 A1 on Nov. 14, 2002, and which, in turn, claims priority benefit from United Kingdom Patent Application Number GB 0111204.4, which was filed on May 8, 2001.

BACKGROUND OF THE INVENTION

Field of the Invention

The invention relates generally to a high flux, high energy photon source, and in particular to a pulsed plasma source.

It is desirable in various applications to produce photons with wavelengths in the extreme ultra-violet (EUV) range, in the region of around 1-50 nm. One such application, for example, is semi-conductor lithography where increasing demands on resolution require shorter wavelengths.

Various pulsed plasma sources are known for producing EUV. These can be divided into two basic types: electrical/magnetic sources sometimes termed discharge produced plasma (DPP) sources embracing electrical excitation of the plasma using, for example, discharge, capacitative or inductive type systems; and laser produced plasma (LPP) sources. In either case an appropriate pulse is applied to a material, usually a target or working gas, and creates a plasma from which EUV radiation is generated.

Various problems exist with known systems, however, including low efficiency—in the region of 0.25% for electrical/magnetic excitation and 0.5% for LPP (or about 1.5% for LPP with solid/liquid targets). This means that power inputs of 25-150 kW and 5-75 kW, respectively, are likely to be required for lithographic production systems. Attendant to that, high heat loading on the supporting system, bearing in mind that the temperatures generated in the plasma can be of the order of hundreds of thousands of degrees Kelvin in order to reach the optimum temperature for the generation of the desired EUV wavelength, and the creation of large amounts of debris—that is, high velocity, high energy matter created as the plasma expands—from the plasma and from secondary damage/heating are highly problematic for production tools. Scaling LPP and electrical/magnetic excitation to production levels is problematic not only in terms of heating and debris, but also vis-a-vis dose control, cost, reliability, and efficiency. In particular, higher conversion efficiencies could mitigate the thermal and debris issues.

Debris is a significant problem in both LPP and electrical/magnetic excitation systems due to the need for a large and expensive collection optic to share the vacuum space in order to collect a high solid angle of emission. Primary debris from the plasma or secondary debris from chamber components significantly reduce the useable lifespan of such an optic. Heat loading is a problem in that the chamber components will distort and possibly be damaged if sufficient cooling is not available. Moreover, the large collection optic has a very precise shape, and heating easily distorts it beyond usability and/or causes direct damage to the coating.

Cost of ownership is also a serious problem. Although LPP applied to solid/liquid targets currently holds out the possibility of higher conversion efficiencies than electrical/magnetic excitation, the capital cost of the lasers needed for a production level tool is expected to be much higher than that associated with electrical/magnetic excitation. It is not clear which route offers the most attractive solution in this respect, even if the problems of debris and heating can be overcome.

One known electrical/magnetic excitation system described in U.S. Pat. No. 6,084,198 comprises an electrode column in which a plasma sheath is formed. The plasma sheath exits the column and forms a pinch at the end. Gas at the pinch generates EUV photons. The arrangement, however, requires close contact between the working electrodes and the working gas with concomitant issues of electrode damage. Moreover, it is difficult to control plasma parameters such as size, shape, and density and thereby maximize the conversion of electrical energy to the required wavelength of EUV radiation.

U.S. Pat. No. 6,084,198 further discloses a plasma initiator in the form of spark plugs surrounding the electrode column, but this arrangement is inflexible and does not allow much variation in the operating parameters of the working gas/gasses. A further problem is that the spark plugs themselves are exposed to the plasma created and that additional components can be required to avoid damaging re-strikes.

Another electrical/magnetic excitation system is described in U.S. Pat. No. 6,031,241, in which a discharge is formed in a capillary to create a plasma from material introduced into the capillary. This arrangement suffers from the further problem that the plasma is created within the capillary which must therefore be treated to resist the extreme conditions it is subjected to. Maintaining capillary integrity is difficult, and there is a limit to the EUV yield that can be achieved in a single capillary.

A known arrangement is illustrated in FIG. 1 and is generally designated with the reference numeral 10. A gas, preferably an inert gas such as Xenon is fed at high pressure through a nozzle 12. The gas expands supersonically into a cone 14 on exiting the nozzle 12 and is subjected to excitation by a laser 16. A plasma is created which emits EUV radiation collected by a collector 20, which may for example be a parabolic reflector and channeled therefrom for the desired use, for example in semiconductor lithography.

According to this arrangement, the use of a suitably shaped nozzle and supersonic beam of gas produces a high gas density. If for example an inert gas such as Xenon is used, clusters of gas atoms are formed which helps to maintain a high local gas density and is thought to assist EUV generation However various problems arise with the system. Because of the rapid expansion of the gas cone 14, the laser 16 must be focused as close as possible to the nozzle 12 to maintain an acceptable energy density in the plasma. As a result the nozzle 12 is at risk of damage because of its proximity to the plasma, and the arrangement as a whole is physically constrained.

Yet further, the expansion of the gas in a cone away from the nozzle gives rise to debris filling the chamber in an broadly expansive beam. Despite the use of an inert gas as the source gas, this can be damaging to the components of the system and in particular the collector mirror, which is at risk of physical damage from collisions with more massive particles, and chemical damage such as oxidization. This in turn places constraints on the overall chamber design.

Yet further, the gas density is not constant across the cone 14 as a result of which the laser pulse may be absorbed by the lower density periphery of the cone, providing unsatisfactory penetration to the high density center of the source gas cone.

It is known in electrical/magnetic excitation systems that in order to improve the efficiency and stability of EUV generation, additional electrodes or coils can be introduced to pre-ionize source material by electrical/magnetic excitation. Such pre-ionization is known to allow creation of a more stable and well defined plasma as well as enhanced control of the initial conditions, in particular reducing fluctuation between pulses and enhancing dose control. However the pre-ionization electrodes are exposed to potentially damaging conditions. Moreover, spatially smooth pre-ionization is a necessary condition to avoid hot or cold spots in the final plasma. Such variations in temperature reduce the efficiency for emission in the required spectral bandwidth and therefore limit the effectiveness of the device.

Background pressure in known systems can be detrimental as it can give rise to self-absorption, the source gas surrounding the gas cone absorbing some of the EUV radiation before it reaches the collector, reducing the efficiency of the system. In order to reduce the problem of self-absorption in known capillary systems, differential pumping is used. A significant pressure gradient is thus maintained in the known systems requiring costly and high maintenance pumps.

SUMMARY OF THE INVENTION

According to the invention, there is provided a high energy photon source comprising a source material emitter arranged to emit a stream of source material, an excitation component downstream thereof being arranged to create a plasma in the source material for emission of high energy photons and an apertured stop provided therebetween.

The use of the apertured stop, for example in the form of a skimmer plate, gives rise to numerous advantages. Because the apertured stop collimates the beam, the debris created is greatly restricted and also channeled away in the collimation direction from the excitation component and collector, i.e., collimation of the molecular beam is found to restrict the flow of debris in the chamber to a narrow path. In turn, this allows more flexibility with the excitation component location and geometry. In a preferred embodiment, the excitation component comprises an electrical/magnetic excitation component in which case the coil, plate or electrode configuration can be easily varied.

Preferably, the emitter emits source material at a supersonic velocity, yet further improving the channeling away of the beam from the excitation component as it takes place at high speed.

In addition, EUV flux generation can be tuned at will into considerably more efficient conditions. In particular, the volume/cross-section, velocity, and density of the target gas stream can be varied over an extremely wide range to allow optimal efficiency of conversion to EUV radiation by altering the skimmer plate aperture dimensions appropriately.

The variable geometry also allows the size and shape of the EUV emitting volume to be controlled so as to match the requirements of the large collection optic and the lithographic projection system which receives light from said optic.

Preferably, the material emitter, which may be a nozzle, and excitation components are provided in separate chambers divided by the apertured stop. Accordingly, the nozzle side of the chamber can be maintained at a high pressure and the pumping side at a very low pressure to restrict self absorption without the need for differential pumping. Even further, a greater proportion of the gas can be recirculated and recycled.

Yet further, the gas beam provides a "sharp edge," having a fairly constant density across its cross-section. This is particularly advantageous in an alternative embodiment in which the excitation component comprises a laser pulse component as it ensures that laser power is not dissipated in a low density outer portion of the molecular beam.

Further still, the excitation component does not have to be close to the nozzle to pump gas at an appropriate density—because the gas stream is collimated, the excitation component can be located further downstream. This in turn further enhances flexibility in design and configuration of the components.

Preferably the system further comprises a laser pre-ionization element arranged to pre-ionize the source material stream prior to excitation by the excitation component. The laser pre-ionization element may pre-ionize the source material stream at a location upstream of the excitation component excitation region or at a point in time prior to, or during, excitation by the excitation component, preferably at the excitation component excitation region. The use of laser pre-ionization preceding electrical/magnetic EUV generation allows the flexibility to create a range of pre-ionization regimes which can be tailored for example to varying gas column diameters and gas density, and makes use of the possibility of focussing the laser on all or a selected part of the gas beam, whether internal or external to the beam. Laser pre-ionization is effective on a wide range of materials, and can easily and evenly pre-ionize gas at any density, again enhancing the flexibility of the system. Because the laser rise time is short, the focussed spot diameter controllable, and the ionization behavior highly reproducible, the pre-ionization phase can be temporally and physically very closely defined, allowing the creation of conditions that are optimal for subsequent excitation by electric or magnetic means and in particular fine control of the pre-ionization state, density, and shape and pre-plasma temperature.

The laser focussing optic can be spaced further from the beam than a pre-ionization electrode, so reducing its exposure to the harsh environment created by the plasma.

Yet further, it is found in practice that the coupling conditions in an electrical/magnetic pumping scheme are especially suited to the pre-ionization conditions generated by laser pre-ionization. Because the laser itself is non-intrusive, the pre-ionization pulse can easily be focused at the same physical location as the electrical/magnetic excitation, which then effectively pumps the rapidly expanding pre-plasma created by the laser pre-ionization. A particular advantage of this is that pre-ionization of the target in the correct physical location can encourage the main discharge from electrodes to travel directly to the plasma. This helps to avoid prestrikes or mis-strikes, and might even be employed to prevent restrikes via further pulses or otherwise, by channeling away the discharge in the same way that pulsed lasers can be used to channel lightning strikes by pre-ionizing a discharge channel through the atmosphere.

In combination, these features which individually allow improved freedom in parameter variation give rise to a yet higher degree of flexibility. For example, the pre-ionization location is less constrained because of the use of a collimated beam of target gas.

According to a further aspect of the invention, there is provided a high energy photon source comprising a source material emitter arranged to emit a stream of source material, an electrical or magnetic excitation component downstream thereof arranged to create a plasma in the source material for emission of high energy photons, and a laser pre-ionization element arranged to pre-ionize the source material stream prior to excitation by the excitation component.

According to yet a further aspect of the invention, there is provided a high energy photon source comprising a source material emitter arranged to emit a stream of source material at supersonic velocity and an electrical or magnetic excitation component downstream thereof arranged to create a plasma in the source material for emission of high energy photons.

DESCRIPTION OF THE DRAWINGS

Embodiments of the invention will now be described, by way of example, with reference to the drawings, of which.

DETAILED DESCRIPTION OF THE PREFERRED EMBODIMENT

Figure 1:
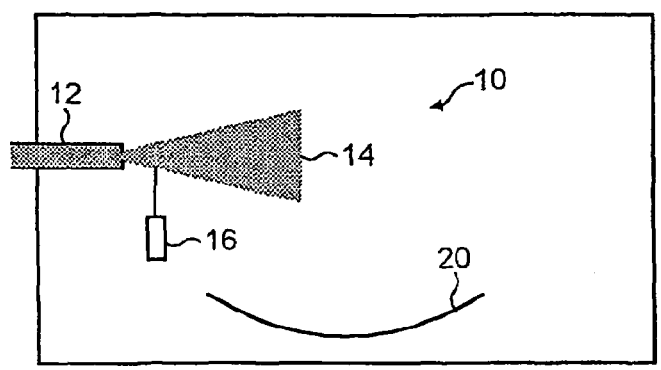
FIG. 1 is a schematic view of a known LPP high energy photon source.

Throughout the specific description, like reference numerals relate to like elements throughout the Figures, and explanation will be repeated only where appropriate.

Figure 2A:
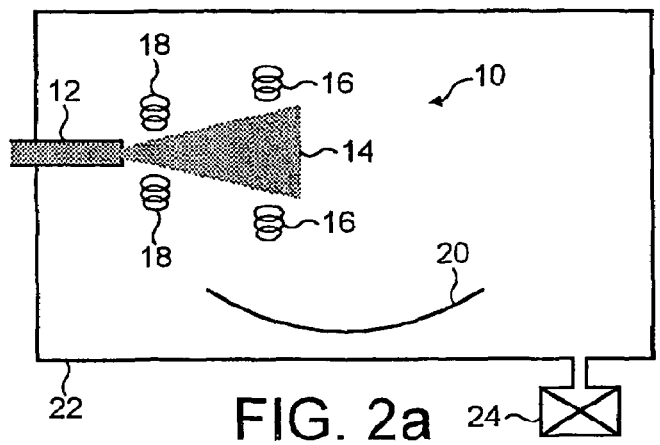
FIG. 2a is a schematic view of an improved high energy photon source.

FIG. 2a relates to an improved EUV source which is generally designated by the reference numeral 10. Xenon is fed at high pressure through a nozzle 12. The gas expands supersonically into a cone 14 on exiting the nozzle 12, and is subjected to electric/magnetic excitation by electrodes or coils 16 which may in practice include induction coils or capacitative plates. In the preferred version shown, the gas stream is pre-ionized by pre-ionization coils 18.

The use of a supersonic molecular beam via a nozzle with electrical/magnetic pumping and/or pre-ionization formed by discharge, capacitative, or inductive excitation of the plasma and/or pre-plasma takes advantage of the high translational velocity of the gas jet to remove debris from critical regions of the chamber and to avoid it impinging on, for example, the collection mirror. However the gas conditions are only suitable for electrical ionization over a relatively narrow range of gas densities and geometries, therefore limiting the range of conditions applicable for any subsequent major energy deposition, and potentially restricting the parameterspace for the plasma to lower efficiency conditions. The arrangement provided in a chamber 22 and a pump 24 is provided to allow differential pumping, but with disadvantages in the level of pumping required to obtain an acceptable pressure differential across the chamber.

Figure 2B:
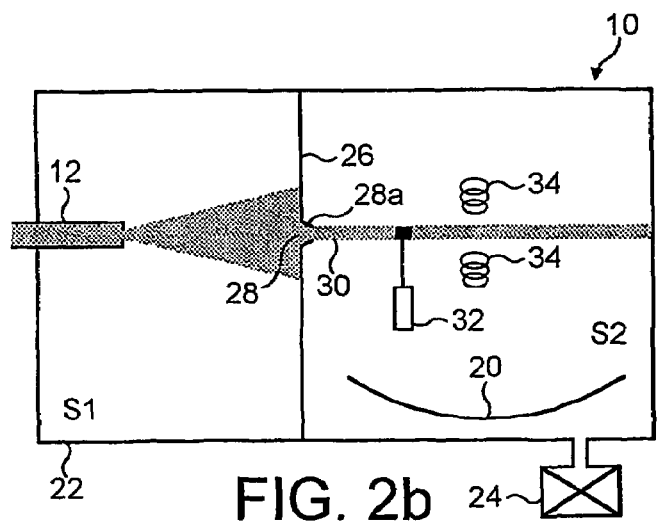
FIG. 2b is a schematic view of an electrical/magnetic high energy photon source according to the present invention.
Figure 2C:
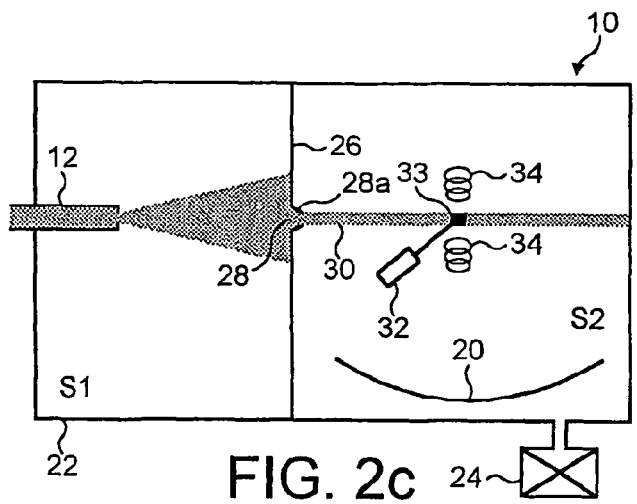
FIG. 2c is a schematic view of an alternative preferred electrical/magnetic high energy photon source according to the present invention.

Referring now to FIG. 2c, a preferred high energy photon source according to the present invention includes the additional components of an apertured stop in the form of a skimmer plate 26 comprising a partition across a chamber 22 and a skimmer orifice 28 acting as a collimator having a converging frusto-conical flange 28a on its downstream face. The gas cone 14 is incident on the skimmer plate and a central column molecular beam 30 having a lower angle of divergence than gas cone 14 and preferably being substantially parallel passes through the orifice 28, the remainder of the gas being recirculated. The beam 30 is then pre-ionized by laser 32 and a plasma is generated downstream between coils/electrodes 34. The plasma produces an EUV flux as described above which is collected by collector 20. The nozzle side S1 of the chamber 22 is maintained at a high pressure and the pumping side S2 at a very low pressure to restrict self absorption via a pump (not shown). The collimated beam allows improved efficiency of plasma generation and reduced debris and self-absorption, as discussed above.

Referring to FIG. 2c it can be seen that the laser pre-ionization pulse is focussed at the same physical location 33 as the subsequent excitation pulse or field. In this case the pre-ionization pulse may precede the excitation pulse by a pre-determined period so that the two steps are temporally rather than spatially separated. The timing of the system is optimized such that maximum coupling is achieved by the excitation component with the rapidly expanding pre-plasma generated by laser pre-ionization. This delay might even be reversed with the electrical switching starting just before the laser. This allows time for the electric, magnetic field to build to a suitable level before creating the receiving plasma. The size and density and ionization state of the pre-plasma formed by laser pre-ionization can of course be controlled by appropriate optics. The non-intrusive nature of laser pre-ionization provides clear advantages in flexibility of location of pre-ionization as a result.

Figure 6:
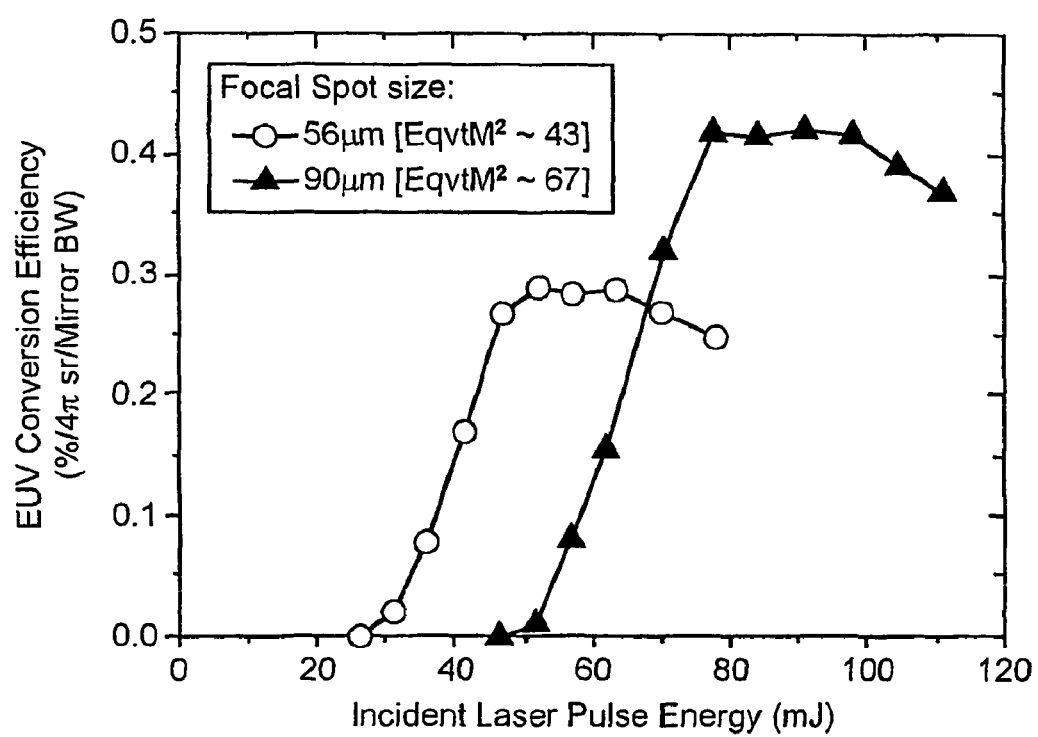
FIG. 6 is a plot of EUV conversion efficiency obtained according to the present invention.

An example of this can be seen in the data of FIG. 6. In this figure the yield of EUV radiation at 13.5 nm is shown as a function of laser pre-ionization excitation density. The peak of the graph corresponds to a plasma temperature which is optimum for EUV generation at this wavelength. Either side of the peak are hotter and cooler plasma temperatures. This demonstrates the inherent flexibility of laser pre-ionization in choosing the ionization state of the plasma yet retaining even ionization conditions.

Figure 3A:
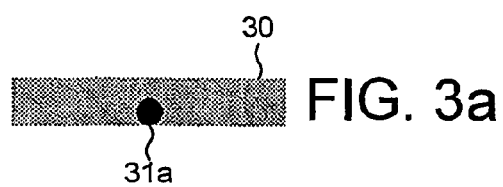
FIG. 3a shows a first pre-ionization scheme.
Figure 3B:
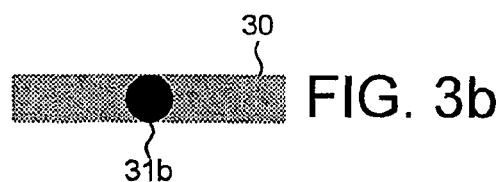
FIG. 3b shows a second pre-ionization scheme.
Figure 3C:
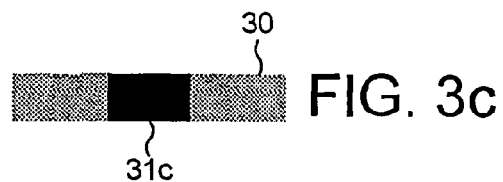
FIG. 3c shows a third pre-ionization scheme.

Further advantages of laser pre-ionization can be understood with reference to FIGS. 3a to 3c. Three exemplary pre-ionization schemes are shown in a beam 30. In FIG. 3a the laser is focussed on a peripheral part 31a of the beam. In FIG. 3b the laser is focussed across the beam cross-section, in an essentially circular spot 31b, and in FIG. 3c a linear portion of the beam is pre-ionized at 31c. In each case it will be appreciated that the pre-ionization pulse will be timed such that the pre-ionized portion of the beam will reach the main electrodes/coils 34 at the moment these are energized for optimum plasma creation efficiency. This includes pre-ionization created spatially within the electrodes/coils as in FIG. 2c. Again as discussed above improved flexibility in system design is thus allowed.

Figure 4:
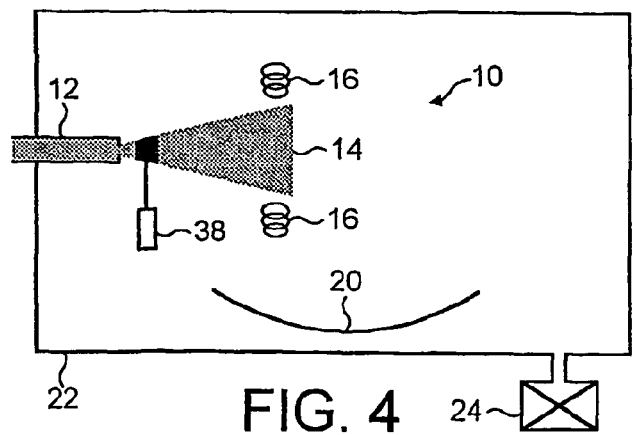
FIG. 4 is a schematic view of an alternative electrical/magnetic high energy photon source according to the present invention.

Indeed a further variant is shown in FIG. 4 in which the skimmer plate is dispensed with and laser pre-ionization is provided using laser 38 upstream of electrical/magnetic excitation coils/electrodes 16 or (not shown) spatially local as in FIG. 2c, providing once again the advantages of laser pre-ionization discussed above.

Figure 5:
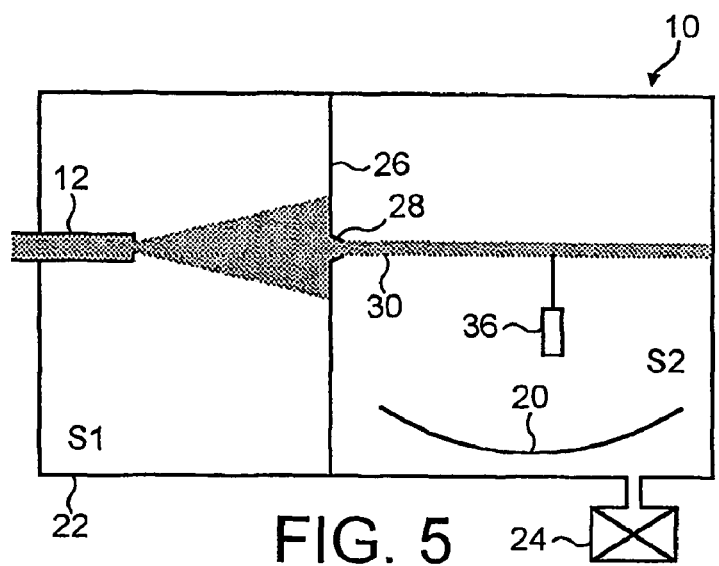
FIG. 5 is a schematic view of an LPP high energy photon source according to the present invention.

It will be appreciated, however, that the system will also operate with a skimmer plate but no pre-ionization. An alternative, LPP configuration according to the present invention is shown in FIG. 5. In this arrangement the electrodes 34 are replaced by a laser pump 36 together with appropriate optics (not shown), as a result of which pre-ionization is not required in the preferred embodiment. It will be appreciated that the LPP pumping scheme shown in FIG. 5 can equally be replaced with an electrical/magnetic pump such as that shown in FIGS. 2a to 2c.

The nature, construction and materials of the individual components of the system will be well known to the skilled person and the ranges that follow are exemplary rather than limiting. The source gas is preferably an inert gas such as Xenon although any other appropriate gas may be used, together with a buffer gas such as Helium. According to the best mode presently contemplated the gas is introduced at a pressure in the range 1-50 bar through a nozzle aperture in the range 0.1-0.4 mm into the high pressure side S1 of the chamber 22 which is maintained at a pressure 0.02-100 mbar. The skimmer aperture is in the range 0.1 to 20 mm with flange angle between 2°-45°. The collimated beam 30 enters the low pressure side S2 of the chamber 22 at a pressure in the range $10^{-4}$-10 mbar with a divergence angle in the range 4°-45° and a beam diameter in the range 0.3 to 3 mm. The low pressure side S2 of the chamber 22 is maintained at a pressure in the range $10^{-4}$-$10^{-8}$ mbar. The various pressures can be maintained using pumps of any appropriate kind.

The electrodes/coils used can be of any suitable type or configuration suitable for discharge, capacitative or inductive heating/excitation of the plasma. The lasers used either in pre-ionization or for LPP can be of any appropriate type, for example gas lasers, excimer lasers, or solid state lasers. The pre-ionization laser pulse preferably has a rise time in the range 0.2 ns-100 ns and pulse duration between 1 ns and 1000 ns. In the LPP scheme the laser preferably has a repetition rate in the range 1-100 kHz.

It will be appreciated that various aspects of the different embodiments can be altered or interchanged as appropriate. For example the skimmer plate can be used in either the electrical/magnetic excitation or LPP scheme with or without pre-ionization, or indeed with only electrical pre-ionization, or the skimmer plate can be dispensed with under laser pre-ionization. Any appropriate gas can be used and need not necessarily be inert. Indeed the system could be applied to a liquid source material beam; although beam collimation may be less of an issue in such circumstances. Although the discussion above is directed to use of a skimmer plate, the use of any appropriate apertured stop or collimating means is contemplated.

Although the foregoing description of the present invention has been shown and described with reference to particular embodiments and applications thereof, it has been presented for purposes of illustration and description and is not intended to be exhaustive or to limit the invention to the particular embodiments and applications disclosed. It will be apparent to those having ordinary skill in the art that a number of changes, modifications, variations, or alterations to the invention as described herein may be made, none of which depart from the spirit or scope of the present invention. The particular embodiments and applications were chosen and described to provide the best illustration of the principles of the invention and its practical application to thereby enable one of ordinary skill in the art to utilize the invention in various embodiments and with various modifications as are suited to the particular use contemplated. All such changes, modifications, variations, and alterations should therefore be seen as being within the scope of the present invention as determined by the appended claims when interpreted in accordance with the breadth to which they are fairly, legally, and equitably entitled.

What is claimed is:

1. A high energy photon source comprising:
    a source material emitter arranged to emit a stream of source material at supersonic velocity;
    an excitation component downstream of said source material emitter which is arranged to create a plasma in the source material for emission of high energy photons;
    an apertured stop located between said source material emitter and said excitation component which collimates said stream, wherein said apertured stop is operable to collimate said stream of source material for excitation by said excitation component;
    a laser pre-ionization element arranged to pre-ionize said stream of source material prior to excitation by the excitation component and to thereby control at least one of the pre-ionization state, the pre-plasma temperature, the density and the shape of the plasma to be created; and,
    wherein said excitation component comprises an electrical or magnetic excitation component.

2. A high energy photon source as defined in claim 1, wherein said apertured stop comprises:
    a skimmer plate.

3. A high energy photon source as defined in claim 1, wherein said excitation component comprises:
    a laser pulse component.

4. A high energy photon source as defined in claim 1, wherein said source material emitter and said excitation component are provided in separate chambers divided by said apertured stop.

5. A high energy photon source as defined in claim 1, wherein said laser pre-ionization element pre-ionizes said stream of source material stream at a location upstream of a region adjacent said excitation component excitation.

6. A high energy photon source as defined in claim 1, wherein said laser pre-ionization element pre-ionizes said stream of source material stream at a point in time prior to its excitation by said excitation component.

7. A high energy photon source as defined in claim 6, wherein said laser pre-ionization element pre-ionizes said stream of source material at a region adjacent said excitation component excitation.

* * * * *